(12) United States Patent
Yang et al.

(10) Patent No.: US 7,291,975 B2
(45) Date of Patent: Nov. 6, 2007

(54) MASK FOR ORGANIC ELECTRO-LUMINESCENCE DEVICE AND METHOD OF FABRICATING THE SAME

(75) Inventors: Jae Young Yang, Gyeongsangbuk-do (KR); Hong Seok Choi, Seoul (KR); Chong Hyun Park, Daegu (KR)

(73) Assignee: LG Electronics Inc., Seoul (KR)

( * ) Notice: Subject to any disclaimer, the term of this patent is extended or adjusted under 35 U.S.C. 154(b) by 368 days.

(21) Appl. No.: 11/047,720

(22) Filed: Feb. 2, 2005

(65) Prior Publication Data

US 2005/0199580 A1    Sep. 15, 2005

(30) Foreign Application Priority Data

Feb. 4, 2004    (KR) .................. 10-2004-0007255

(51) Int. Cl.
*H01J 1/62*    (2006.01)
(52) U.S. Cl. ...................... 313/506; 313/498
(58) Field of Classification Search ............. 313/498, 313/402, 504, 506
See application file for complete search history.

(56) References Cited

U.S. PATENT DOCUMENTS 6,255,775 B1 *    7/2001    Ikuko et al. ............ 313/506

* cited by examiner

*Primary Examiner*—Vip Patel
(74) *Attorney, Agent, or Firm*—Birch, Stewart, Kolasch & Birch, LLP (57) ABSTRACT

This invention relates to a mask for an organic electro-luminescence device and a method of fabricating the same that is capable of forming an organic layer having a special color without a damage of an organic layer formed on a substrate.

The mask for the organic electro-luminescence device includes: an open part formed in a hole type to pass an organic material for forming a first organic layer on a substrate; and a blocking part having a groove on a surface facing to at least one second organic layer formed on the substrate, wherein the groove has a width corresponding to a width of the second organic layer.

3 Claims, 14 Drawing Sheets

MASK FOR ORGANIC ELECTRO-LUMINESCENCE DEVICE AND METHOD OF FABRICATING THE SAME

This application claims the benefit of Korean Patent Application No. P2004-07255 filed in Korea on Feb. 4, 2004, which is hereby incorporated by reference.

BACKGROUND OF THE INVENTION

1. Field of the Invention

This invention relates to an electro-luminescence device, and more particularly, to a mask for an organic electro-luminescence device and a method of fabricating the same that is capable of forming an organic layer having a special color without a damage of an organic layer formed on a substrate.

2. Description of the Related Art

Recently, there have been developed various flat panel display devices reduced in weight and bulk that is capable of eliminating disadvantages of a cathode ray tube (CRT). Such flat panel display devices include a liquid crystal display (LCD), a field emission display (FED), a plasma display panel (PDP) and an electro-luminescence (EL) display, etc. device.

In such flat panel display devices, the PDP has the most advantage for making a large dimension screen because its structure and manufacturing process are simple, but has a drawback in that it has low light-emission efficiency and large power consumption. The LCD has a difficulty in making a large dimension screen because it is fabricated by a semiconductor process, but has an expanded demand as it is mainly used for a display device of a notebook personal computer. However, the LCD has a drawback in that it has a difficulty in making a large dimension screen and it has large power consumption due to a backlight unit. Also, the LCD has characteristics of a large light loss and a narrow viewing angle due to optical devices such as a polarizing filter, a prism sheet, a diffuser and the like.

On the other hand, the EL display device is largely classified into an inorganic EL device and an organic EL device. When compared with the above-mentioned display devices, the EL display device has advantages of a fast response speed, large light-emission efficiency, a large brightness and a large viewing angle. The organic EL display device can display a picture at approximately 10[V] and a high brightness of ten thousands of $[cd/m^2]$.

Figure 1:
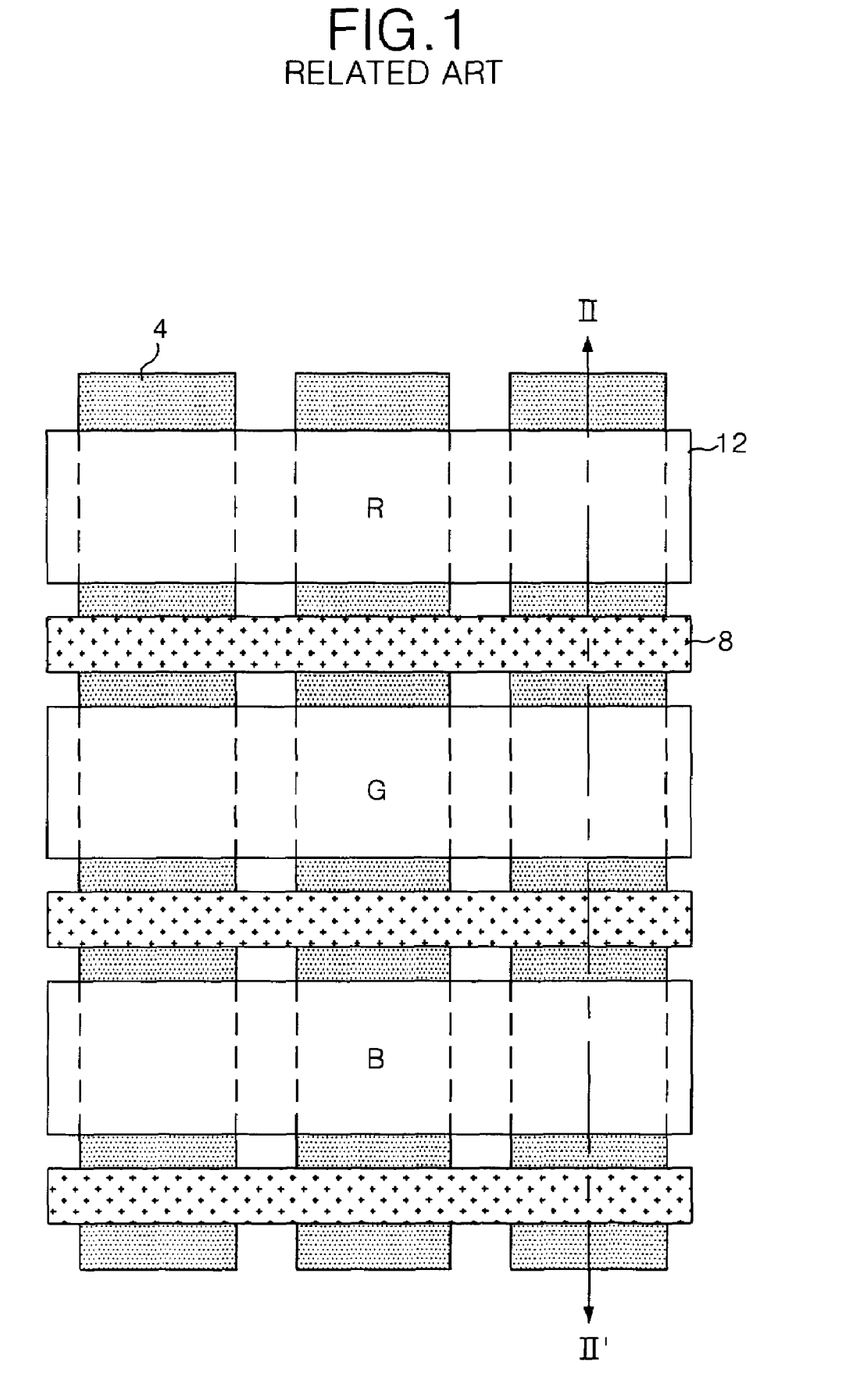
FIG. 1 is a plan view illustrating a related art organic electro-luminescence device.
Figure 2:
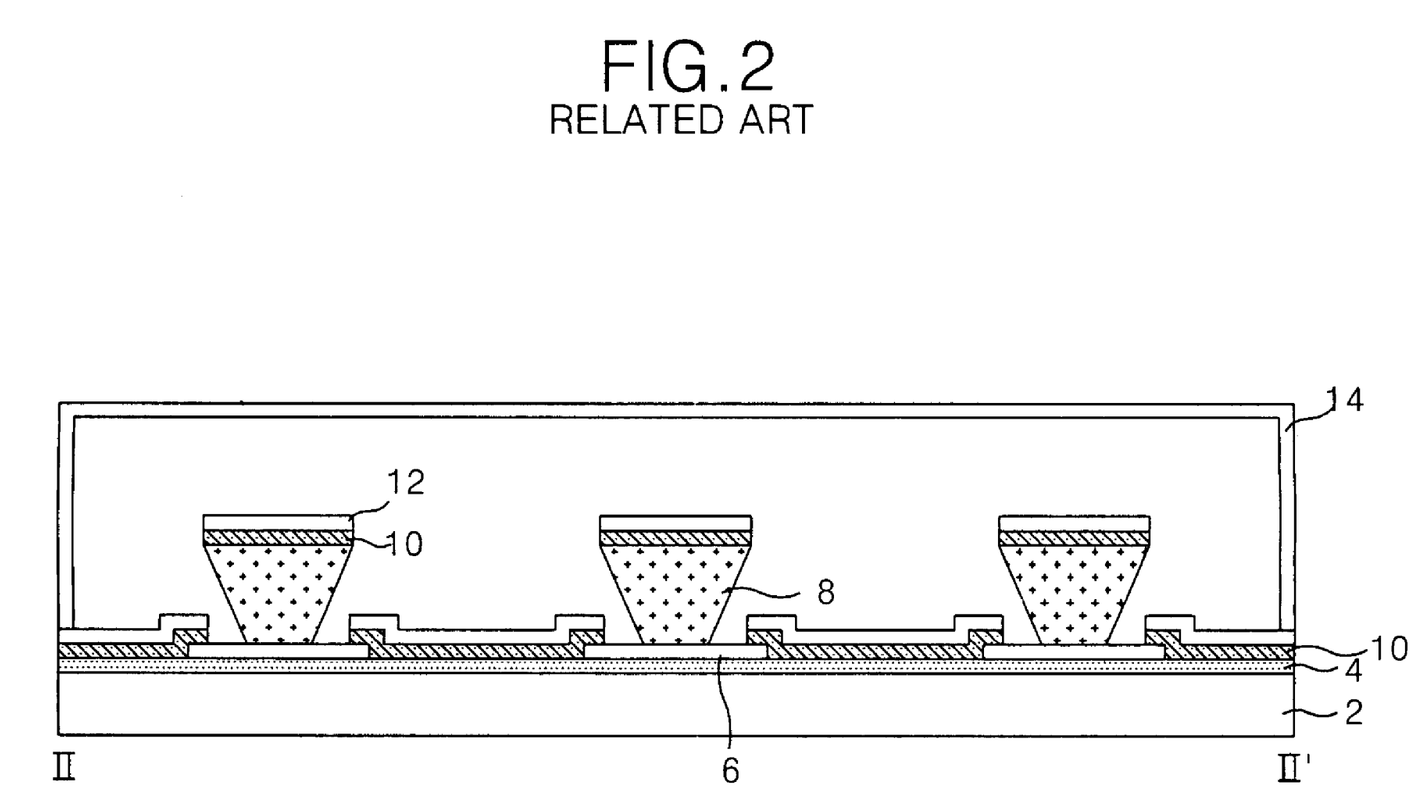
FIG. 2 is a sectional view the organic electro-luminescence device taken along a line II-II' in FIG. 1.

FIG. 1 is a plan view illustrating a related art organic electro-luminescence (EL) display device, and FIG. 2 is a sectional view illustrating the organic EL display device taken along a line II-II' in FIG. 1.

Referring to FIGS. 1 and 2, the related art organic EL display device comprises a insulating film 6, a barrier rib 8, and an organic layer 10, formed between an anode electrode 4 and a cathode electrode 12. The anode electrode 4 and the cathode electrode 12 are crossing so as to insulate from each other.

A plurality of anode electrodes 4 is provided on the substrate 2 in such a manner to be spaced at a predetermined distance from each other. A first driving signal is supplied to such the anode electrode 4 in order to emit an electron (or hole).

The insulating film 6 is formed in a lattice type so as to expose an aperture for each EL cell area on the substrate 2 having the anode electrode 4.

The barrier rib 8 is formed in a direction crossing the anode electrode 4, and is formed in parallel to the cathode electrode 12 by a predetermined distance to partition adjacent EL cells. In other words, the barrier rib 8 separates the organic layers 10 from each other and the cathode electrodes 12 from each other between the adjacent EL cells. Further, the barrier rib 8 has an overhang structure in which the upper portion thereof has a larger width than the lower portion thereof.

The organic layer 10 made from an organic compound on the insulating film 6. In other words, the organic layer 10 is formed by depositing a hole carrier layer, a light-emitting layer and an electron carrier layer onto the insulating film 6.

A plurality of cathode electrodes 12 is provided on the organic layer 10 in such a manner to be spaced at a predetermined distance from each other, and in such a manner to be crossed with the anode electrodes 4. A second driving signal is supplied to the cathode electrode 12 in order to emit an electron (hole).

The substrate 2 having the cathode electrode 12 is protected by use of a packaging plate 14. In other words, the packaging plate 14 covers the anode electrode 4, the cathode electrode 12, and the organic layer 10 formed on the substrate 2, by using an sealant (not shown), so as to prevent the organic layer 10 from being deteriorated by moisture and oxygen in the atmosphere. After pressuring the packaging plate 14 to the substrate 12 to encapsulate the anode electrode 4, the cathode electrode 12, and the organic layer 10, the sealant is hardened by irradiating an ultraviolet ray. After encapsulating, an inert gas is injected in a space formed by sealing the substrate 2 and the packaging plate 14. At this time, the encapsulated atmosphere is performed in a globe box or a vacuum chamber.

In the organic EL device, when the first and the second driving signals are respectively applied to the anode electrode 4 and the cathode electrode 12, an electron and a hole are emitted. The electron and the hole emitted from the anode electrode 4 and the cathode electrode 12 recombine in the organic layer 10, and at the same time, visible rays are generated. At this time, the generated visible rays are emitted to the exterior via the anode electrode 4, to thereby display a predetermined picture or image.

Figure 3A:
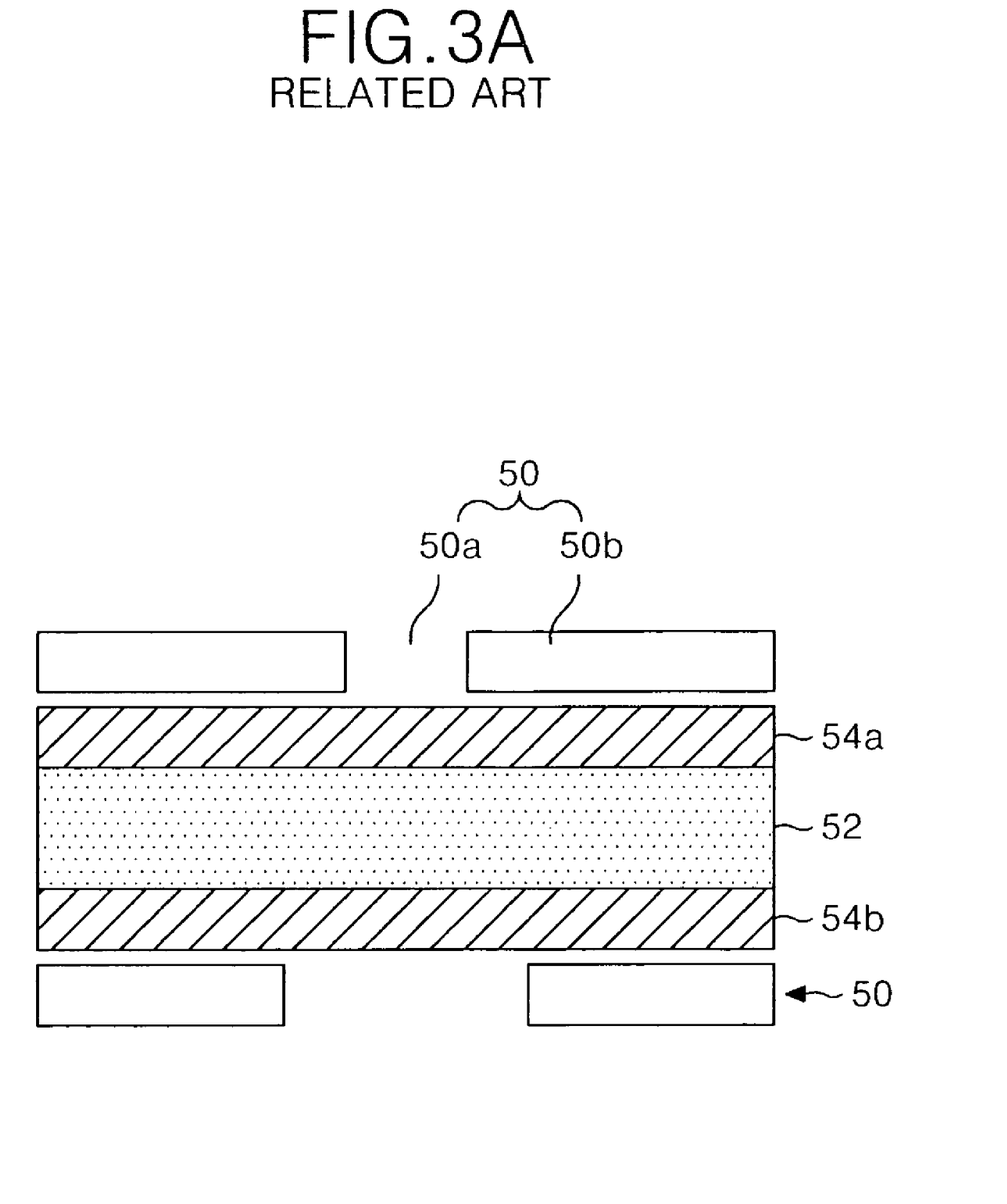
FIGS. 3A to 3C are sectional views illustrating a method of manufacturing a shadow mask used for forming red, green, and blue organic layers shown in FIG. 2.
Figure 3B:
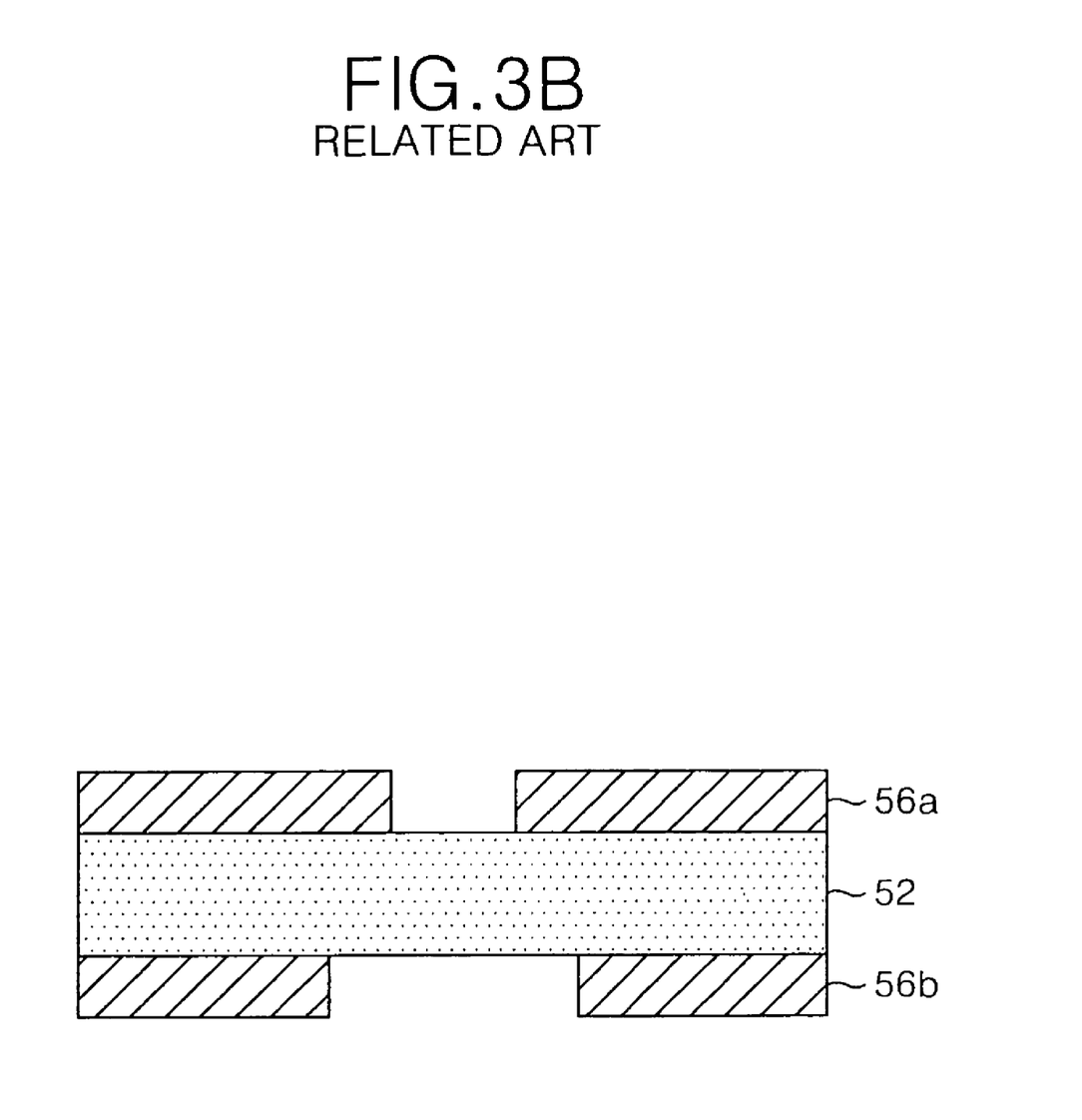
Figure 3C:
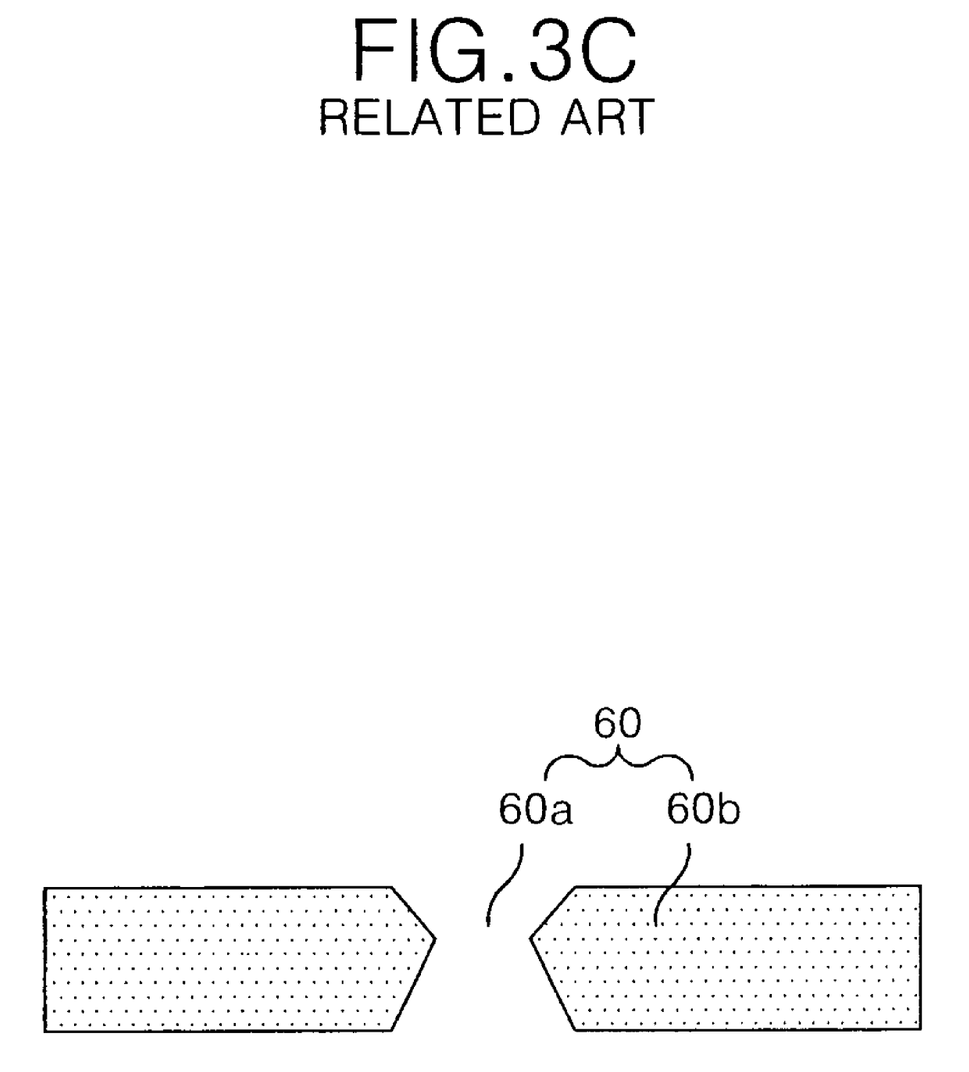

FIGS. 3A to 3C are sectional views illustrating a method of manufacturing a shadow mask used for forming the organic layer shown in FIG. 2.

Figure 4:
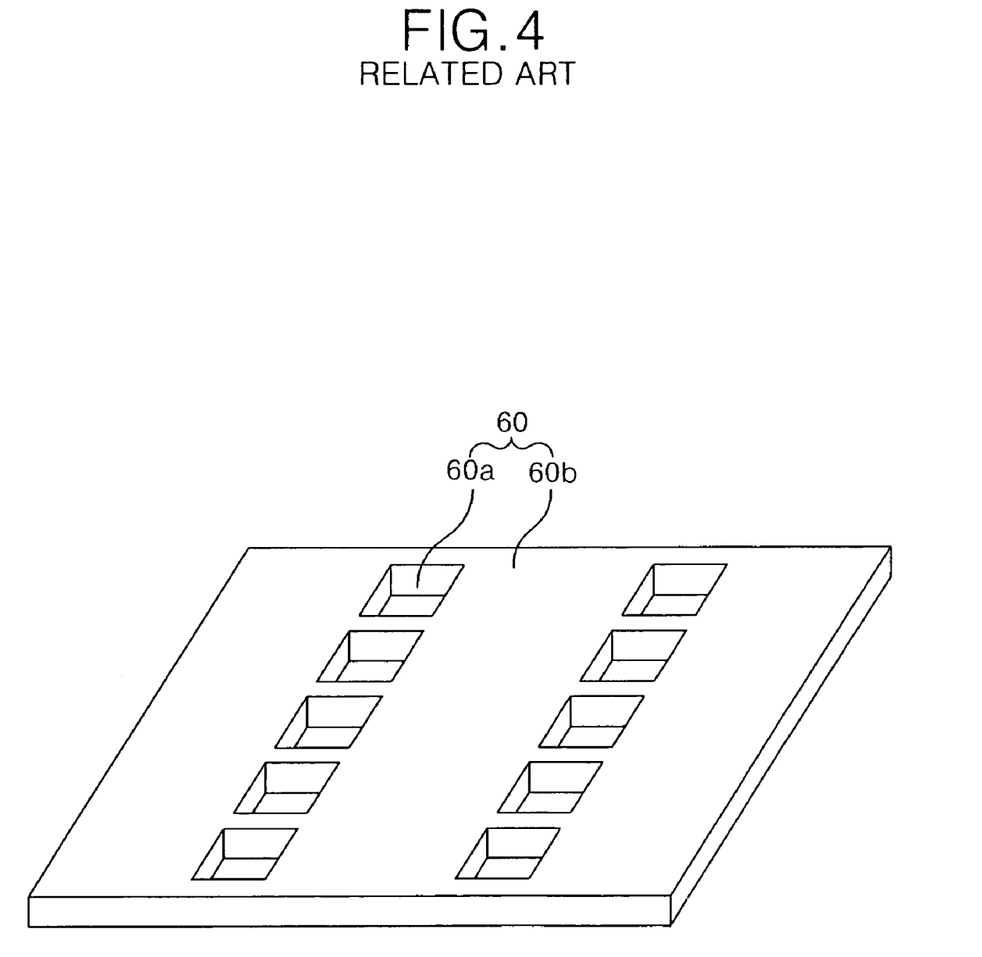
FIG. 4 is a plan view the shadow mask formed by the manufacturing method showed in FIGS. 3A to 3C.

Firstly, as shown in FIG. 3A, an upper photo-resist 54a and a lower photo-resist 54b are entirely printed on a front surface and a rear surface of the metal plate 52, respectively. A photo mask 50 having a shielding part 50b and a transmissive part 50a is arranged on each of the front surface and the rear surface of the metal plate 52 having the printed upper and lower photo-resists 54a and 54b. The upper and the lower photo-resists 54a and 54b are patterned through a photolithography process including an exposing process using a mask and a developing process, to thereby form an upper and a lower photo-resist patterns 56a and 56b, as shown in FIG. 3B. The metal plate 52 is etched by using the upper and the lower photo-resist patterns 56a and 56b, to thereby form a shadow mask 60 having an open part 60a and a blocking part 60b, as shown in FIGS. 3C and 4.

Red, green, and blue organ layers 10R, 10G, and 10B are formed by using the shadow mask 60. For instance, the blue organic layer 10B is described referring to FIGS. 5A and 5B.

Figure 5A:
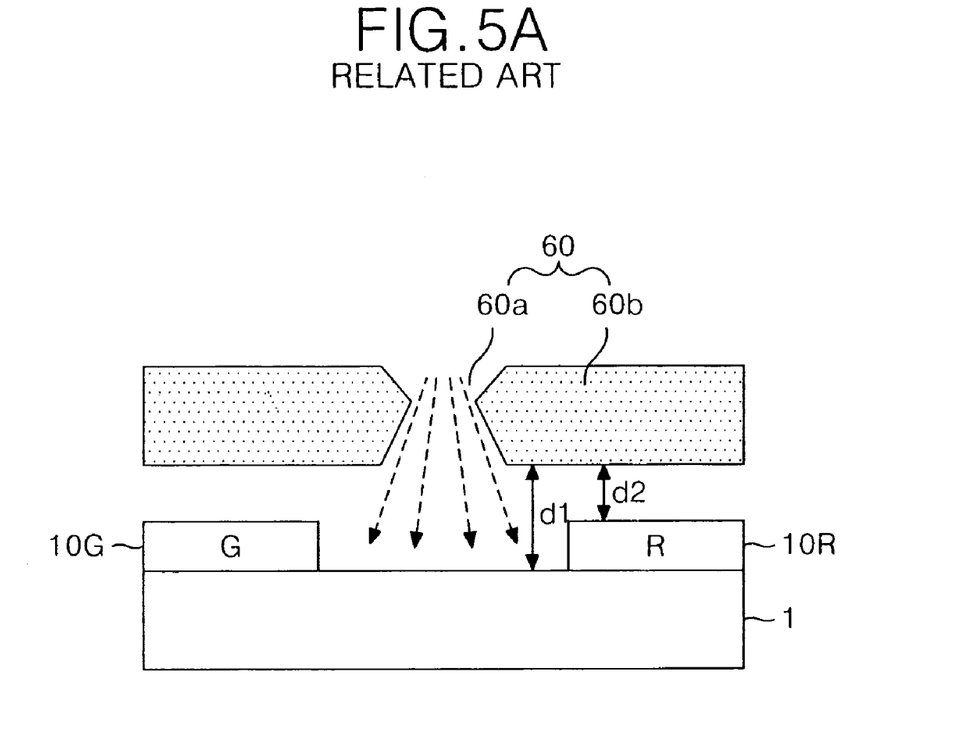
FIGS. 5A and 5B are sectional views the manufacturing method of the organic layers shown in FIG. 2.
Figure 5B:
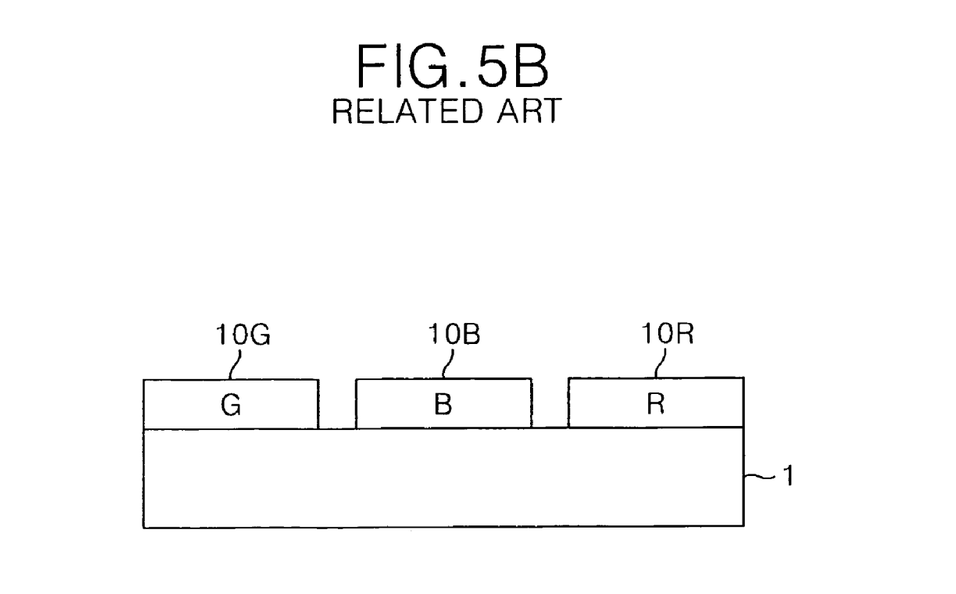

Firstly, a shadow mask 60 having an open part 60a and a blocking part 60b is arranged on a substrate 1 having red and green organic layers 10R and 10G. The open part 60a of the shadow mask 60 is located at an area corresponding to an area where the blue organic 10B is being formed, and the blocking part 60b is located at an area hiding an area where the red and the green organic layers 10R and 10G are formed. A blue organic material is screen-printed by using the shadow mask 60. Thereby, the blue organic material passing the open part 60a of the shadow mask is separated from the red and the green organic layers 10R and 10G with a barrier rib (not shown) therebetween to form the blue organic layer 10B.

Meanwhile, the related art red, green, and blue organic layers 10R, 10G, and 10B are formed by using the shadow mask 60 on a substrate 1. In this case, as a distance between the shadow mask 60 and the substrate 1 becomes far, color purity between the adjacent EL cells becomes deteriorated. For instance, at the time that blue organic layer 10B is formed on the substrate 1 having the red and the green organic layers 10R and 10G, as the distance between the shadow mask 60 and the substrate 1 becomes far, a probability that the blue organic material is spread to adjacent red and green organic layers 10R and 10G becomes high. Accordingly, there is a problem that color purity is deteriorated.

In order to prevent the above problem, as shown in FIG. 5A, a first distance d1 between the shadow mask 60 and the substrate 2 relatively becomes short, to thereby form a first organic layer (e.x., the blue organic layer). In this case, because a second distance d2 formed between the shadow mask 60 and each of second organic layers (e.x., the red and the green organic layers) is closer than the first distance, a probability that the shadow mask 60 and the second organic layer are being contacted becomes high. Accordingly, there is a problem that the shadow mask 60 is separated from the second organic layer or a scratch is generated in the organic layer.

SUMMARY OF THE INVENTION

Accordingly, it is an object of the present invention to provide a mask for an organic electro-luminescence device and a method of fabricating the same that is capable of forming an organic layer having a special color without a damage of an organic layer formed on a substrate.

In order to achieve these and other objects of the invention, a mask for an organic electro-luminescence device comprises: an open part formed in a hole type to pass an organic material for forming a first organic layer on a substrate; and a blocking part having a groove on a surface facing to at least one second organic layer formed on the substrate, wherein the groove has a width corresponding to a width of the second organic layer.

At least one groove is formed to correspond to at least one of second organic layers.

One groove is formed with a width corresponding to a whole width of at least two of second organic layers formed on the substrate.

In order to achieve these and other objects of the invention, a method of manufacturing a mask for an organic electro-luminescence device comprises: forming a blocking part by patterning a metal plate on a surface facing to at least one organic layer formed on substrate, wherein the blocking part has a groove with a width corresponding to a width of the organic layer; and forming an open part of a hole type, by patterning the metal plate having the groove, to pass an organic material.

The forming the blocking part having the groove includes: forming a first photo-resist on a front surface and a second photo-resist on a rear surface, respectively; forming a first photo-resist pattern by patterning the first photo-resist; and etching the metal plate by use of the first photo-resist pattern as a mask.

The forming the open part of the hole type includes: forming a third photo-resist on the metal plate including the blocking part having the groove; forming a second photo-resist pattern by patterning the second photo-resist; and etching the metal plate by use of the second photo-resist pattern as a mask.

At least one groove is formed to correspond to at least one organic layer.

One groove is formed with a width corresponding to a whole width of at least two of organic layers formed on the substrate.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 6 to 9B.

Figure 6:
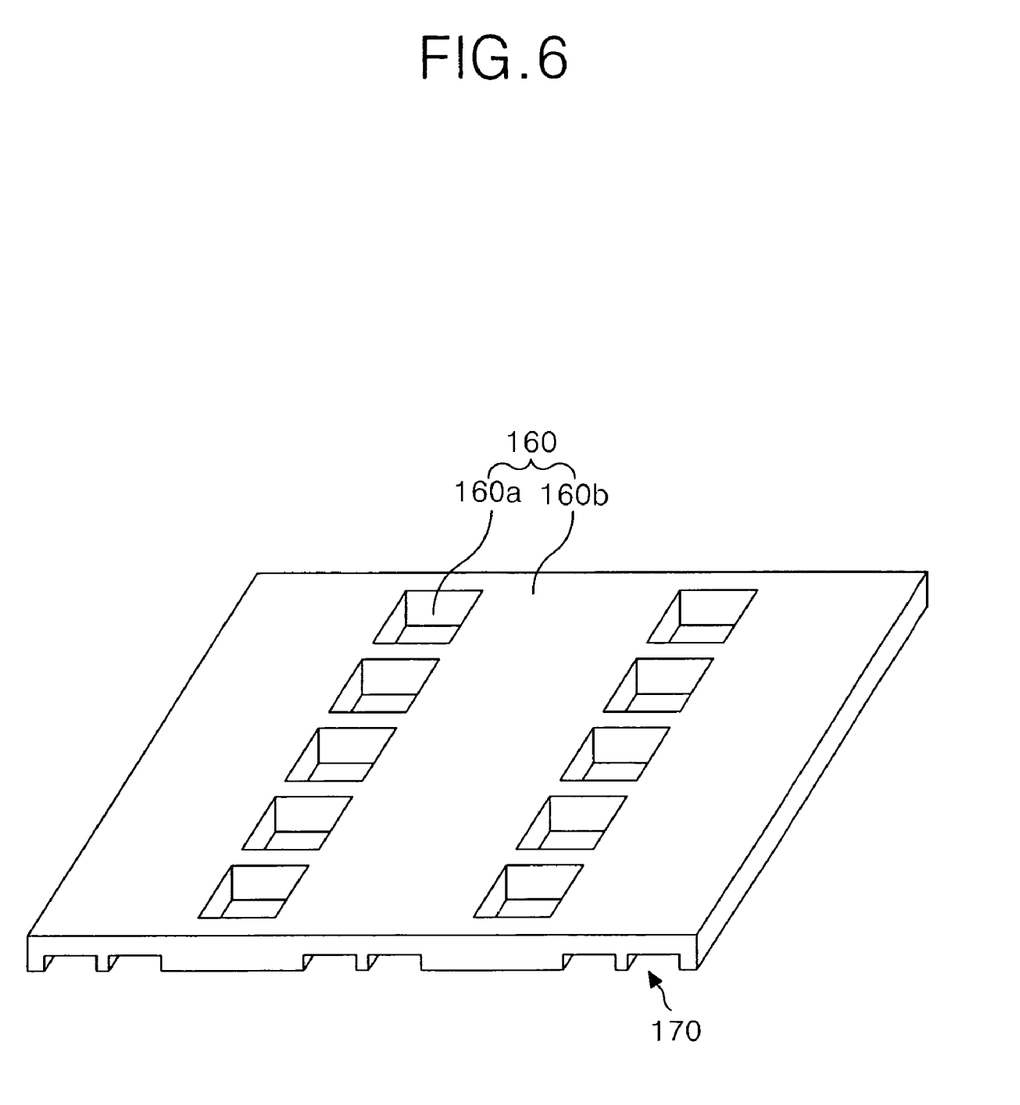
FIG. 6 is a plan view illustrating a shadow mask according to the present invention.

FIG. 6 shows a plan view of a shadow mask for forming an organic layer of an organic electro-luminescence (EL) panel.

A shadow mask 160 shown in FIG. 6 includes an open part 160a formed to overlap with an area where an organic layer of a special color is being formed, and a blocking part 160b formed to overlap with an area where the organic layer of the special color is not being formed.

The open part 160a is formed in a hole type penetrating the shadow mask 160 so that an organic material making the organic layer of the special color is printed on a substrate. Herein, the organic layer includes at least one of a hole carrier layer, a light-emitting layer, and an electron carrier layer.

Figure 7A:
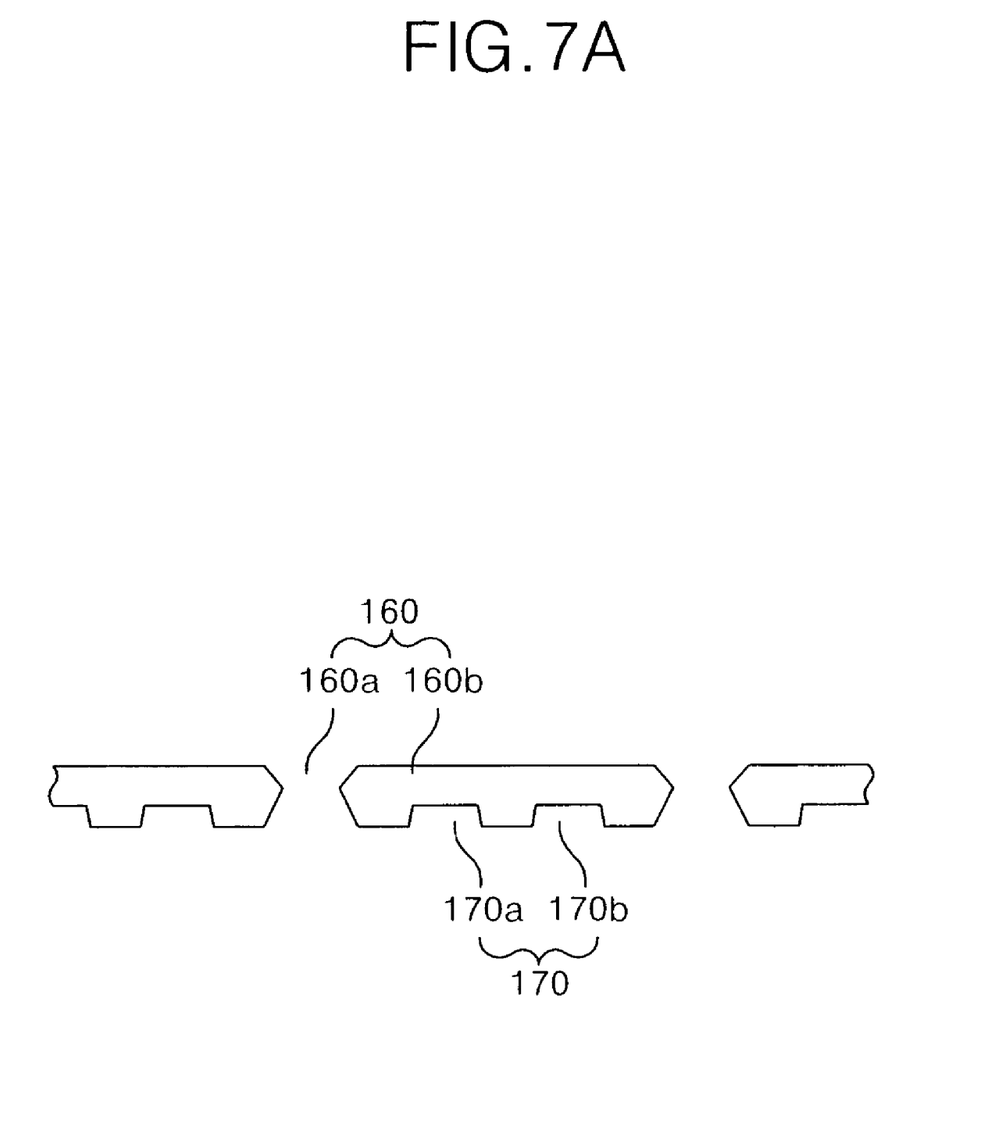
FIGS. 7A and 7B are sectionals illustrating various types of the shadow mask shown in FIG. 6.
Figure 7B:
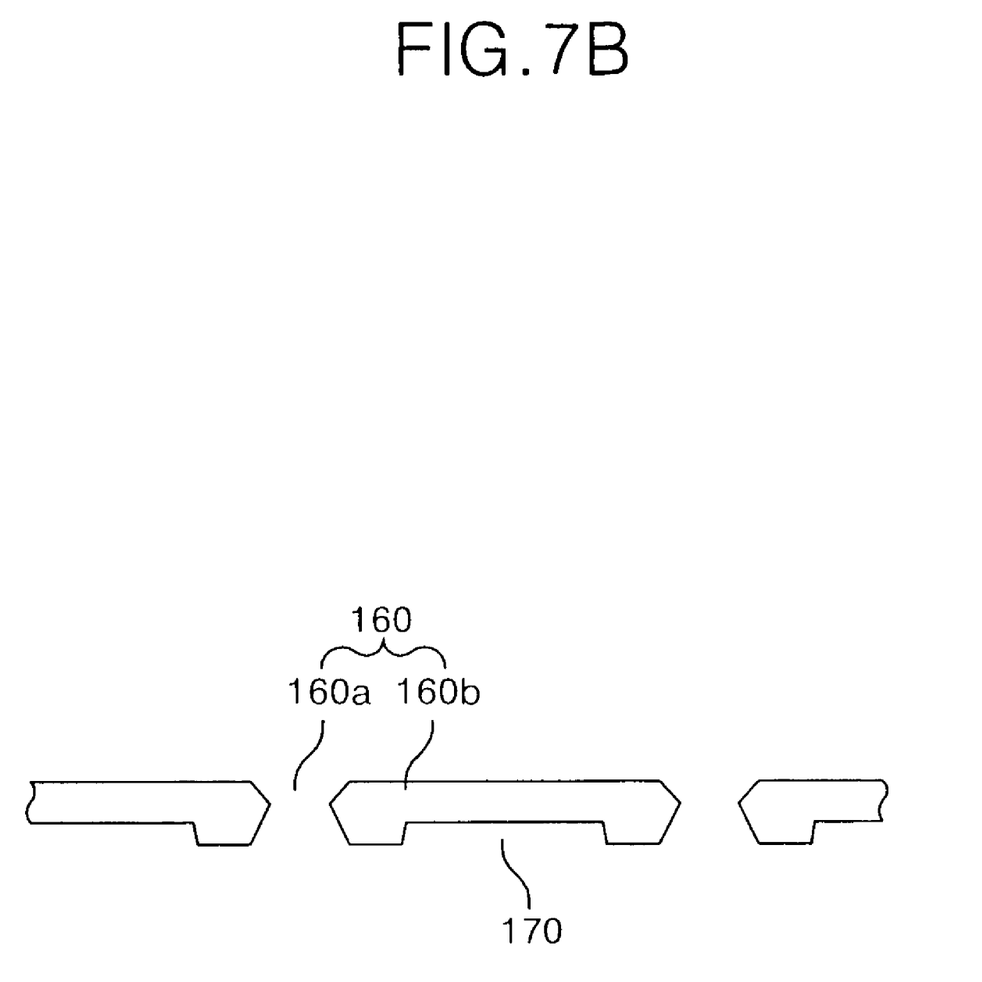

In the blocking part 160b, a groove 170 is formed at an area corresponding to an organic layer of other colors except for the special color. As shown in FIGS. 7A and 7B, at least one groove 170 is formed at the area corresponding to the organic layer of the other colors except for the special color. For instance, in a case that the organic layer of the special color is a blue organic layer, grooves 170a and 170b are respectively formed at areas corresponding to red organic layer and green organic layer as shown in FIG. 7A, or one groove 170 is formed at an area corresponding to the whole of the red organic layer and the green organic layer as shown in FIG. 7B. Herein, the groove 170 in FIG. 7A is formed with a width more than a width of each organic layer and the groove 170 in FIG. 7B is formed with a width more than sum of widths of at least two organic layers.

When the organic layer of the special color is formed by use of the shadow mask 160 on the substrate, it is possible to prevent a contact of the shadow mask 160 with the organic layer already formed on the substrate, by the groove 170 of the blocking part.

FIGS. 8A to 8F are sectional views a method of manufacturing the shadow mask shown in FIG. 6.

Figure 8A:
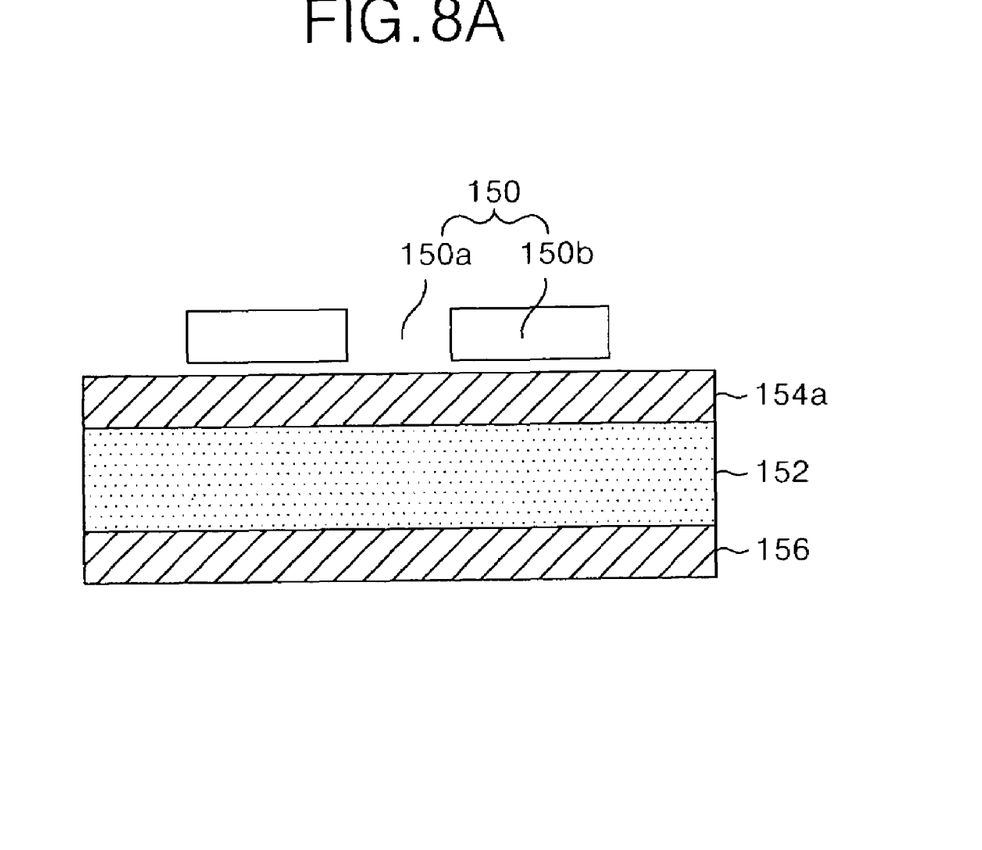
FIGS. 8A to 8F are sectional views a method of manufacturing the shadow mask shown in FIG. 6.
Figure 8B:
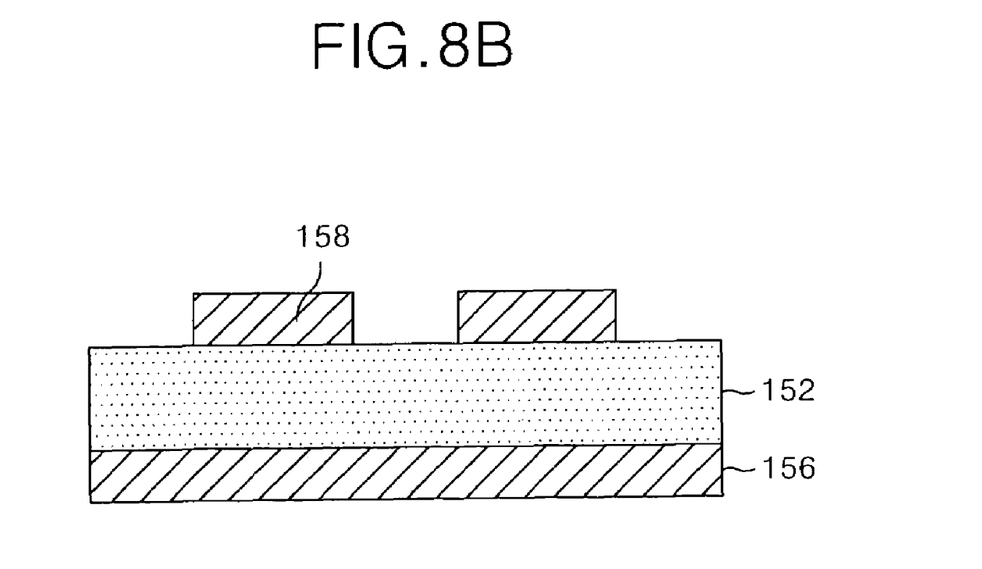
Figure 8C:
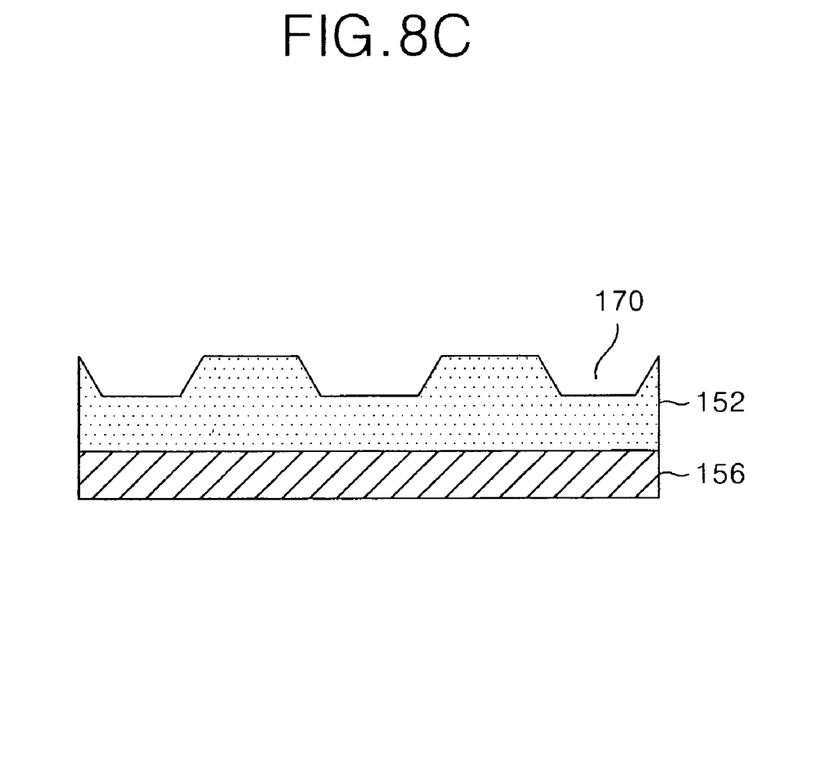
Figure 8D:
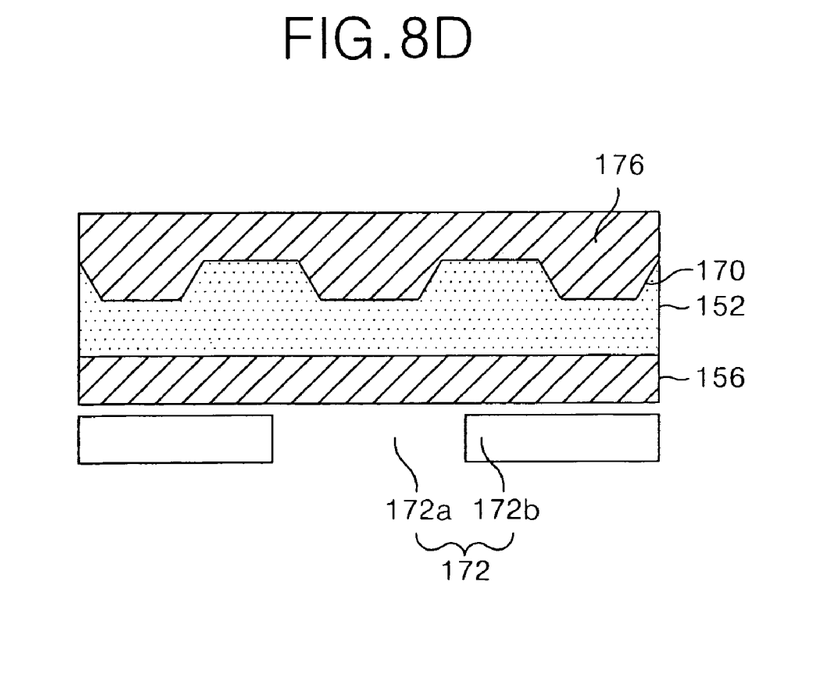
Figure 8E:
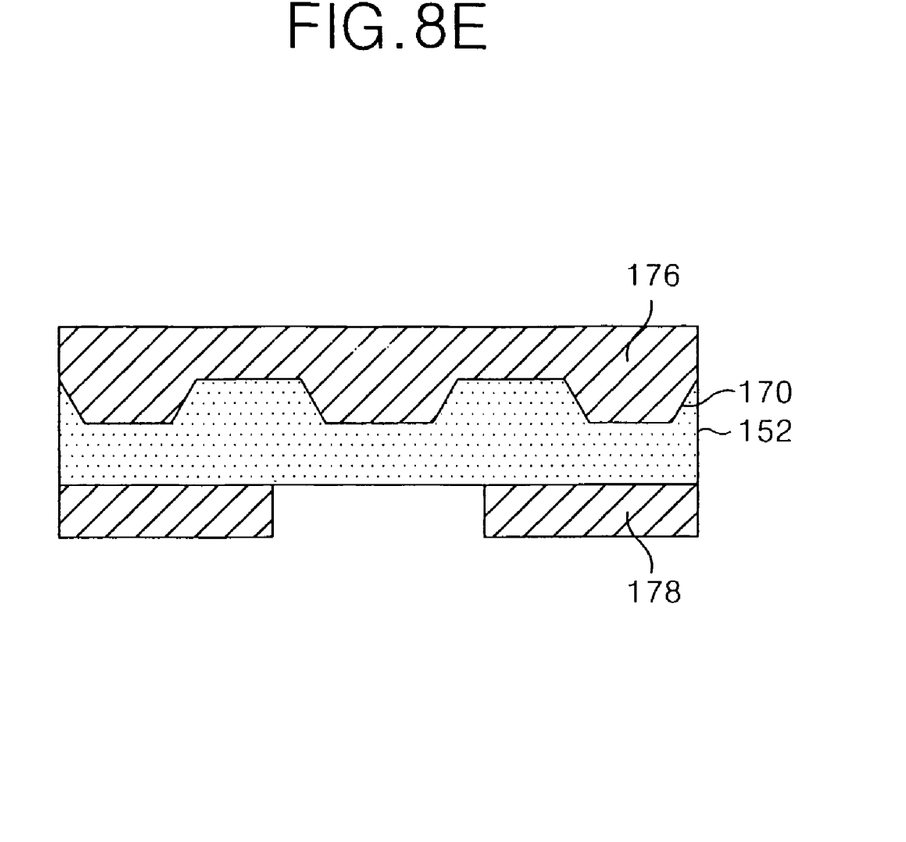
Figure 8F:
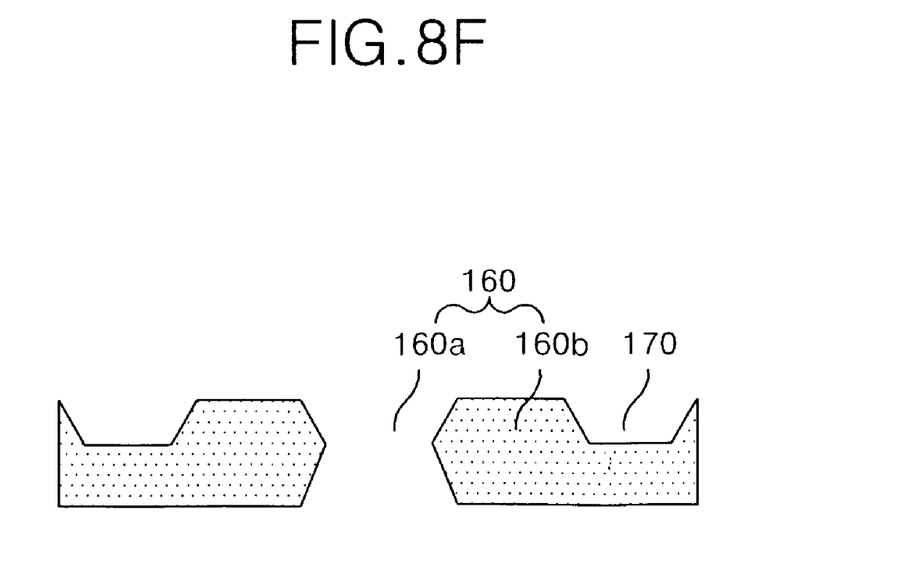

Firstly, as shown in FIG. 8A, a first photo-resist 154 and a second photo-resist 156 are entirely printed on a front surface and a rear surface of a metal plate 152, respectively. A first mask 150 having an open part 150a and a blocking part 150b is arranged on the front surface of the metal plate 152 having the printed first and second photo-resists 154 and 156. The first photo-resist 154 is patterned through a photolithography process including an exposing process using the first mask 150 and a developing process, to thereby form a first photo-resist pattern 158 as shown in FIG. 8B. The metal plate 152 is etched by using the first photo-resist pattern 158, to thereby form a groove 170 on the front surface of the metal plate 152, as shown in FIG. 8C. Herein, a third photo-resist 176 is formed in order to prevent a damage of the groove of the blocking part upon an etching process to be performed later. Thereafter, a second mask 172 having an open part 172a and a blocking part 172b is arranged on the rear surface of the metal plate 152. The second photo-resist 156 is patterned through a photolithography process including an exposing process using the second mask 172 and a developing process, to thereby form a second photo-resist pattern 178 as shown in FIG. 8E. The metal plate 152 is etched by using the second photo-resist pattern 178, to thereby form a hole penetrating the metal plate 152, as shown in FIG. 8F. Accordingly, a shadow mask 160 including the open part 160a having the hole type and the blocking part 160b having at least one groove 170 is formed.

Figure 9A:
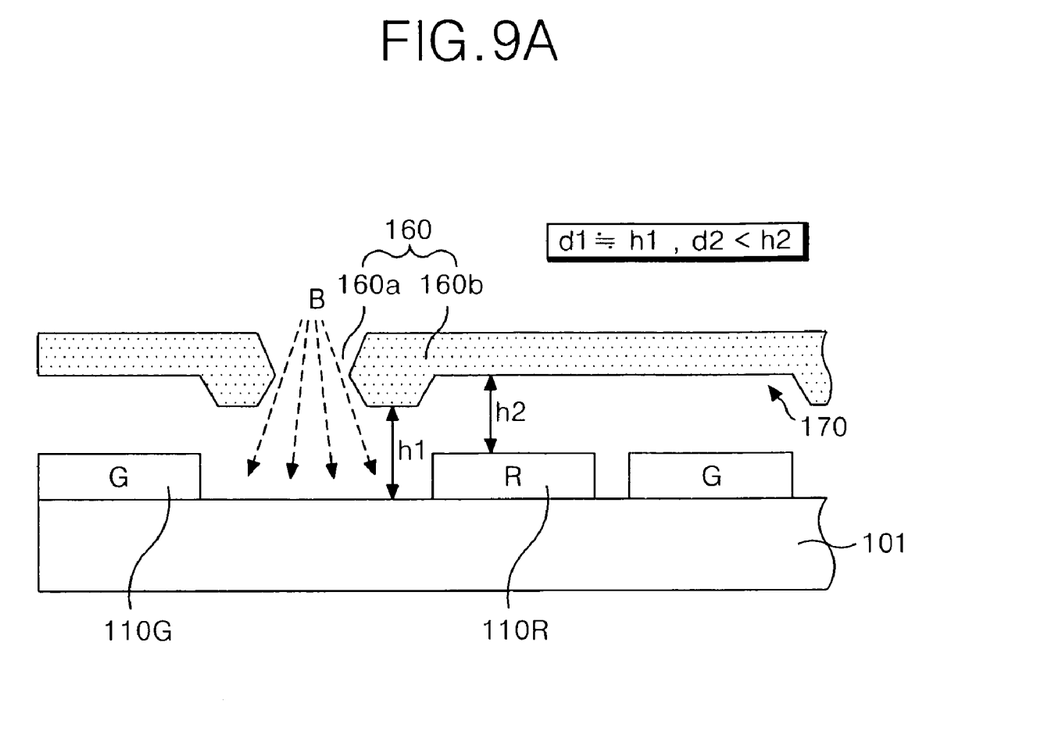
FIGS. 9A and 9B are a manufacturing method of a organic layer formed by using the shadow mask shown in FIG. 6.
Figure 9B:
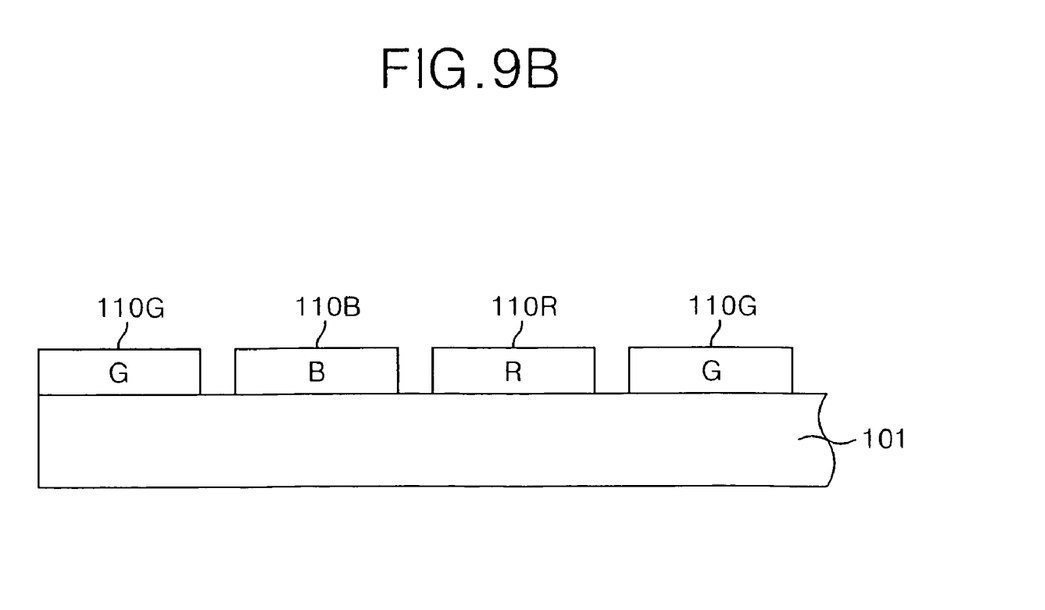

FIGS. 9A and 9B are a manufacturing method of an organic layer formed by using the shadow mask shown in FIG. 6. Herein, a method of manufacturing a blue organic layer on a substrate having red and green organic layers will be described as an example.

Firstly, the shadow mask 160 having the open part 160a and the blocking part 160b is arranged on a substrate 101 having red and green organic layers 110R and 110G. The open part 160a of the shadow mask 60 is located at an area corresponding to an area where the blue organic 110B is being formed, and the blocking part 160b is located at an area hiding an area where the red and the green organic layers 10R and 10G are formed. At this time, even through the shadow mask 160 is separated from the substrate 101 by a relatively close distance h1 in order to prevent a pattern badness, a distance h2 between the groove 170 formed in the blocking part 160b and each of the red and green organic layers 110R and 110G becomes farther than that of the related art. Accordingly, it is possible to prevent a contact of the shadow mask 160 with the red and green organic layers 110R and 110G already formed on the substrate 101.

A blue organic material is screen-printed by using the shadow mask 160. Thereby, the blue organic material passing the open part 160a of the shadow mask is separated from the red and the green organic layers 110R and 110G with a barrier rib (not shown) therebetween to form the blue organic layer 110B.

Meanwhile, even if there is no detail description, the red and green organic layers are formed by use of the shadow mask, having a groove in its blocking part, in the same method as the method of manufacturing the blue organic layer.

As described above, in a mask for an electro-luminescence device and a method of fabricating the same, a blocking part having a groove is comprised. Accordingly, even through the shadow mask is separated from the substrate 101 by a relatively close distance in order to prevent a pattern badness, it is possible to prevent a contact of the shadow mask with the red and green organic layers because of the groove formed in the blocking part.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A mask for an organic electro-luminescence device comprising:
    an open part formed in a hole type to pass an organic material for forming a first organic layer on a substrate; and
    a blocking part having a groove on a surface facing to at least one second organic layer formed on the substrate, wherein the groove has a width corresponding to a width of the second organic layer.

2. The mask according to claim 1, wherein at least one groove is formed to correspond to at least one of second organic layers.

3. The mask according to claim 1, wherein one groove is formed with a width corresponding to a whole width of at least two of second organic layers formed on the substrate.

* * * * *